United States Patent
An

(10) Patent No.: US 8,187,497 B2
(45) Date of Patent: May 29, 2012

(54) PHOSPHOR, METHOD FOR PREPARING THE SAME, AND LIGHT EMITTING DIODE USING THE SAME

(75) Inventor: Joong In An, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 380 days.

(21) Appl. No.: 12/445,181

(22) PCT Filed: Jan. 21, 2008

(86) PCT No.: PCT/KR2008/000359
§ 371 (c)(1),
(2), (4) Date: Apr. 10, 2009

(87) PCT Pub. No.: WO2008/091084
PCT Pub. Date: Jul. 31, 2008

(65) Prior Publication Data
US 2010/0052514 A1    Mar. 4, 2010

(30) Foreign Application Priority Data
Jan. 24, 2007  (KR) .......................... 10-2007-007388

(51) Int. Cl.
*C09K 11/59* (2006.01)
*C09K 11/77* (2006.01)
(52) U.S. Cl. .................. 252/301.4 R; 313/503
(58) Field of Classification Search .............. 313/503; 252/301.4 R
See application file for complete search history.

(56) References Cited

U.S. PATENT DOCUMENTS

| | | | | |
|---|---|---|---|---|
| 5,985,176 A | * | 11/1999 | Rao | 252/301.6 F |
| 7,311,858 B2 | * | 12/2007 | Wang et al. | 252/301.4 F |
| 2004/0058195 A1 | | 3/2004 | Kita et al. | |
| 2006/0022208 A1 | * | 2/2006 | Kim et al. | 257/98 |
| 2006/0091778 A1 | | 5/2006 | Setlur et al. | |
| 2006/0284185 A1 | * | 12/2006 | Kim et al. | 257/79 |
| 2006/0290284 A1 | * | 12/2006 | Klinedinst et al. | 313/635 |
| 2007/0029526 A1 | * | 2/2007 | Cheng et al. | 252/301.4 F |

FOREIGN PATENT DOCUMENTS

| | | |
|---|---|---|
| CN | 1788361 A | 6/2006 |
| JP | 2003-261868 A | 9/2003 |
| JP | 2006-036943 A | 2/2006 |
| WO | WO-2004/085570 A1 | 10/2004 |
| WO | WO-2006/108013 A2 | 10/2006 |

* cited by examiner

*Primary Examiner* — Karabi Guharay
(74) *Attorney, Agent, or Firm* — Birch, Stewart, Kolasch & Birch, LLP

(57) ABSTRACT

Disclosed are a phosphor, method for preparing the same, and light emitting diode using the same. The method comprises the steps of preparing a precursor solution by mixing strontium nitrate ($Sr(NO_3)_2$), tetraethyl orthosilicate (TEOS), and europium oxide (Eu) with each other, forming a gel by heating the precursor solution, drying the gel specimen, performing calcination by removing water and organic materials from the dried gel, and preparing a phosphor by reducing the Eu of the gel.

9 Claims, 2 Drawing Sheets

[Fig. 1]
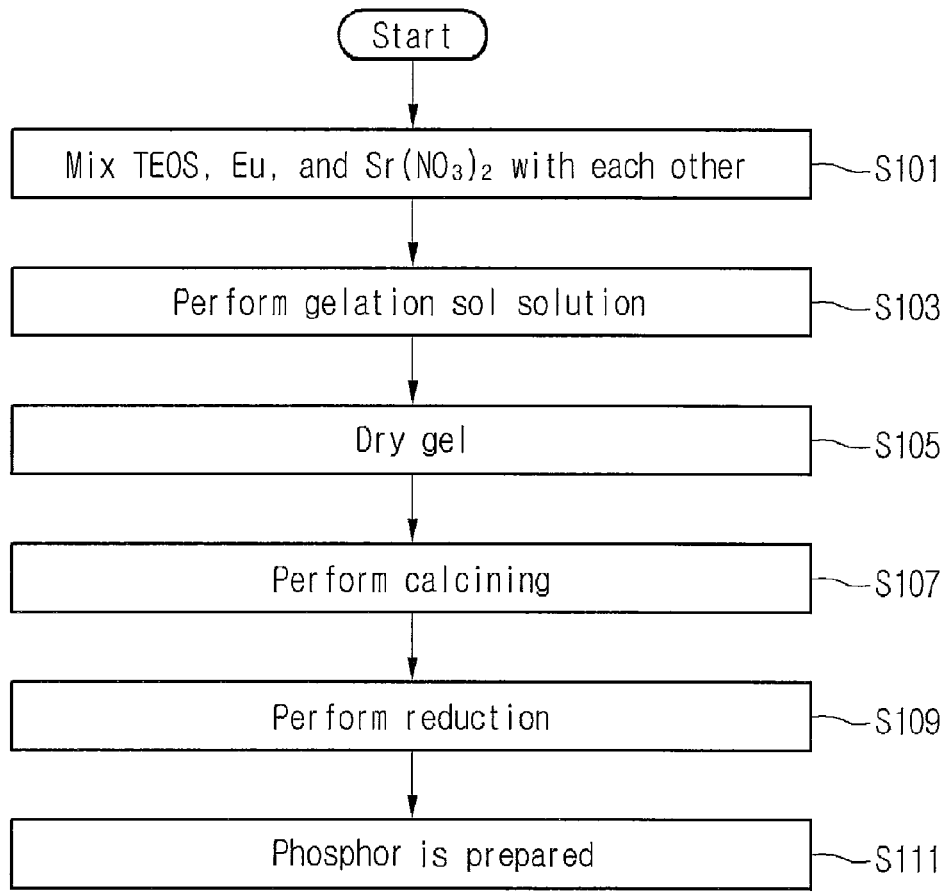
[Fig. 2]
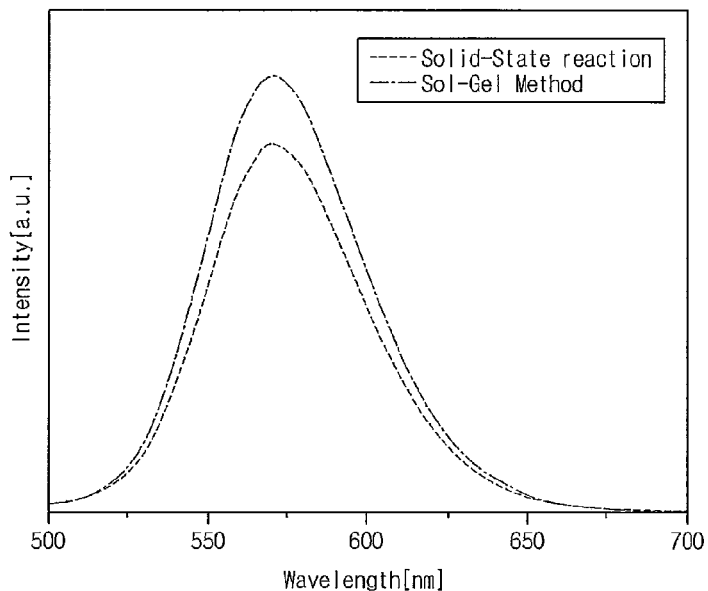

Fig. 3
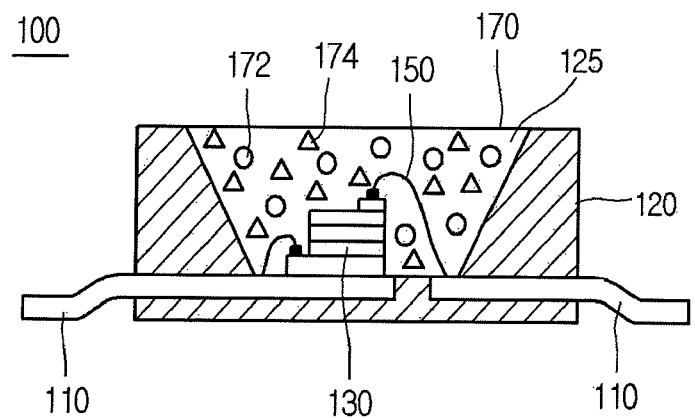
[Fig. 4]
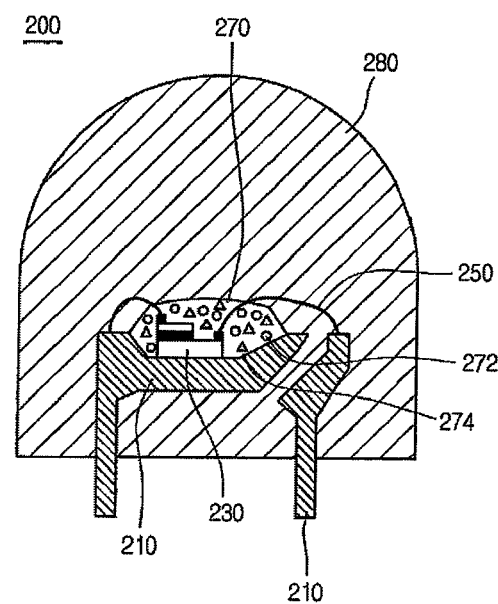

PHOSPHOR, METHOD FOR PREPARING THE SAME, AND LIGHT EMITTING DIODE USING THE SAME

TECHNICAL FIELD

The embodiment relates to a phosphor, a method for preparing the same, and a light emitting diode using the phosphor.

BACKGROUND ART

A phosphor includes a matrix consisting of a crystalline inorganic compound and an activator for changing the matrix into an effective fluorescent material, and emits absorbed energy as light. A physical process for generating fluorescent light from the phosphor is to radiate a portion of light energy absorbed in the fluorescent material. Such a light emitting characteristic of the phosphor is an important factor in determination of the luminance and the color of a semiconductor light emitting device.

Generally, in order to synthesize functional materials of the phosphor, a solid-state reaction scheme has been mainly used.

DISCLOSURE OF INVENTION

Technical Problem

The embodiment provides a phosphor and a method for preparing the same using a sol-gel method, and a light emitting diode using the phosphor.

Technical Solution

An embodiment provides a method for preparing a phosphor comprising: preparing a precursor solution by mixing strontium nitrate ($Sr(NO_3)_2$), tetraethyl orthosilicate (TEOS), and europium oxide (Eu) with each other; forming a gel by heating the precursor solution; drying the gel specimen; performing calcination by removing water and organic materials from the dried gel; and preparing a phosphor by reducing the Eu of the gel.

An embodiment provides a phosphor comprising: a silicate-based phosphor prepared through a sol-gel scheme using a precursor solution obtained by mixing strontium nitrate ($Sr(NO_3)_2$), tetraethyl orthosilicate (TEOS), and europium oxide (Eu) with each other.

An embodiment provides a light emitting diode comprising: a plurality of lead frames, a light emitting diode chip electrically connected to the lead frames, a resin member molded around the light emitting diode chip, and a silicate-based phosphor comprised in the resin member and prepared using a sol-gel scheme.

Advantageous Effects

In a phosphor and a method for preparing the same, and a light emitting diode using the phosphor according to the embodiment, the phosphor is synthesized through a sol-gel method, so that the homogeneity of a multi-component compound can be increased, and the multi-component compound can be densely calcined.

In addition, the luminance of the phosphor can be improved, so that the luminance of a white light emitting diode employed for an LCD light source, an LED lamp, an LED for an indicator, and a fluorescent lamp can be improved.

BRIEF DESCRIPTION OF THE DRAWINGS

FIG. 1 is a flow chart showing a method for preparing a phosphor according to the embodiment;

FIG. 2 is a graph showing the comparison of the luminance of a phosphor through a solid-state reaction scheme and the luminance of phosphor through a sol-gel method according to the embodiment;

FIG. 3 is a sectional view showing the structure of an SMD-type white light emitting diode employing a phosphor prepared through a sol-gel method according to the embodiment; and FIG. 4 is a sectional view showing the structure of a vertical-lamp-type white light emitting diode employing a phosphor prepared through a sol-gel method according to the embodiment.

BEST MODE FOR CARRYING OUT THE INVENTION

Hereinafter, the embodiment will be described with respect to accompanying drawings.

FIG. 1 is a flow chart showing a method for preparing a phosphor according to the embodiment.

Referring to FIG. 1, starting materials are synthesized into a precursor solution (step S101). The starting materials comprise strontium nitrate ($Sr(NO_3)_2$), tetraethyl orthosilicate (TEOS), and europium oxide (Eu). In addition, a flux comprises ammonium fluoride, fluorine (F), or Ci. The TEOS and the Eu have the degree of purity of about 98% and 99.99%, respectively. The ammonium fluoride has the degree of purity of about 99% as the flux.

The $Sr(NO_3)_2$ and the TEOS serve as a matrix of a phosphor, and the Eu serves as an activator for doping the matrix. The TEOS is an organic solvent for Si, all organic components are removed, and Si, which is an inorganic matter, remains in calcination.

The mixing ratio of the starting materials is Sr=(3−x) mol, TEOS=1 mol, and Eu=x mol, wherein $0.001 \leq x \leq 1$.

A material obtained by dissolving the TEOS in ethanol is mixed with a material obtained by dissolving the $Sr(NO_3)_2$ in water (distilled water), and then the Eu, which is an activator, is added to the mixed solution, thereby preparing the precursor solution. In this case, the activator may be added when the $Sr(NO_3)_2$ is dissolved in water. If the activator is not dissolved in water, nitric acid is added so as to obtain a pure solution, and then the Eu, which is the activator, may be added to the solution.

In this case, the pH of the precursor solution is adjusted to 1 in order to obtain spherical phosphor particles. In addition, the ratio of water to the TEOS is 60~90:1.

If such a precursor solution is prepared, the gelation process is performed (step S103). In the gelation process, the precursor solution is circulated and heated for a long time in a thermostat having a temperature in the range of 65° C. to 70° C., so that the precursor solution is gelled. In this case, the heating time is changed according to an amount of water. If a great amount of water is used, gelation time is prolonged. If the minimum amount of water is used, the gelation time is shortened.

The gelation of the sol solution through a sol-gel method is performed as a result of a hydrolysis reaction or a condensation reaction. For the gelation of the sol solution, a hydrolysis reaction occurs before silica polymer is created, in which the silica polymer is prepared by bonding monomers of "=Si—O—Si=" through the polymerization of the TEOS.

In order to prepare a uniform multi-component gel, the hydrolysis reaction and the condensation reaction are simultaneously performed. In addition, since gelation is performed while the fluidity of a sol solution is losing, the hydrolysis reaction and the condensation reaction require a similar reaction speed. Through such a reaction, the sol is solidified into gel.

The hydrolysis reaction is a double decomposition reaction in which a water molecule serves as a reactant, and the polymerization reaction is to make polymer by combining monomers such as "═Si—O—Si═" while releasing molecules when at least two functional groups exist in the monomer. A condensation reaction is an organic reaction in which two molecules react with each other in the presence of a catalyst to combine with the elimination of water or some other simple molecule.

The formed gel is dried (step S105). In such a gel drying step, the starting material is heated and dried under the temperature in the range of 80° C. to 200° C., Approximately for 23~25 hours more limitedly 24 hours, such that the water of the gel (in other word, the gel-state specimen) is eliminated as much as possible. In this case, the heating time and temperature may be adjusted according to the characteristic or the state of the starting material. A pulverizing process may be added before and/or after the gel is dried. Through the pulverizing process, the gel is pulverized so that the air or the water of the gel is eliminated or reduced, or the distance between molecules may be shortened.

Then, the gel-state specimen is calcined (step S107). The calcining step is to completely remove water or organic materials from the dried gel, and, in this step, the gel is heated under the temperature in the range of 500° C. to 1000° C., Approximately for 1~5 hours more limitedly 3~5 hours.

In this case, since the reaction is performed in a sol solution state, all chemical reactions are performed in a liquid phase, molecules subject to the reactions form uniform composition, and a 1:1 reaction easily occurs between molecules. In other words, since the reaction is performed in the liquid state, multi-component materials (e.g., Si) are mixed with each other in a molecule unit or an atom unit so that homogeneity is improved. Accordingly, an empty space is minimized when multi-component compounds are synthesized, so that compact calcination can be achieved.

If the gel-state specimen has been calcined, reduction treatment is performed with respect to the specimen (step S109). The reduction step is performed for the replacement reaction of the europium oxide ions or the strontium nitrate ions. For example, the specimen may be heated at a 5% hydrogen gas atmosphere for three hours to five hours under the temperature in the range of 1200° C. to 1350° C., thereby reducing all $Eu^{3+}$ ions to $Eu^{2+}$. In this case, $-Eu^{3+}+N_2-=Eu^{2+}$ is realized.

An oxidized solid, which is finally obtained through the above steps, is a phosphor particle, that is, a phosphor (step S111). Accordingly, a silicate-based yellow phosphor, which is $Sr_{3-x}SiO_5:Eu^{2+}_x(0.001 \leq x \leq 1)$, is prepared.

When fluorescent materials are obtained through the sol-gel method, phosphor particles more densely coheres with each other and can be calcined even under a low temperature because of more tightly making contact with each other in comparison to a solid-state reaction scheme. In addition, since pores are uniformly distributed between the phosphor particles, the porosity of particles is lowered and the diameters of the particles are more uniform, so that a more compact calcined member can be obtained in comparison to the solid-state reaction scheme.

In addition, since the reaction is performed in a liquid state, multi-component materials are mixed with each other in a molecule unit or an atom-unit so that homogeneity can be improved, and the size of the phosphor particle can be adjusted. Further, since an acid-base catalysis is used, so that the shape of the phosphor particle can be adjusted.

The phosphor prepared through the sol-gel method is uniform and compact, and comprises particles smaller than those prepared through the solid-state reaction scheme. In this case, the particles of the phosphor through the sol-gel method have sizes in the range of about 2 μm to about 30 μm.

FIG. 2 is a graph showing the comparative result obtained by comparing the luminance of a phosphor prepared through the solid-state reaction scheme with the luminance of a phosphor prepared through the sol-gel method according to the embodiment. As shown in FIG. 2, the phosphor prepared through the sol-gel method has luminance higher than the luminance of the phosphor prepared through the solid-state reaction scheme.

In addition, since a silicate-based phosphor employing Si as a matrix is prepared through the sol-gel method, the embodiment is adaptable for a silicate-based green phosphor such as $Ba_{2-x}SiO_4:Eu^{2+}_x$, $Ca_{1-x}MgSi_2O_7:Eu^{2+}_x$, or $Sr_{2-x}SiO_4:Eu^{2+}_x(0.001 \leq x \leq 1)$, as well as the silicate-based yellow phosphor.

The silicate-based yellow phosphor prepared through the sol-gel method can be employed for an LCD light source, an LED lamp, an LED for an indicator, and a white light emitting diode for a fluorescent lamp.

FIG. 3 is a sectional view showing a white light emitting diode employing a phosphor prepared through a sol-gel method according to the embodiment.

Referring to FIG. 3, a surface mounting device (SMD)-type light emitting diode 100 comprises a plurality of lead frames 110, a package body 120, a light emitting diode chip 130, and a resin member 170 equipped with a phosphor 172 and 174.

The package body 120 comprises the lead frames 110 disconnected from each other and a cavity 125 formed at the package body 120.

At least one light emitting diode chip 130 is provided in the cavity 125. The light emitting diode chip 130 emits blue light having a main peak of a light emitting spectrum of wavelengths in the range of 400 nm to 480 nm, and is connected to the lead frames 110 through a wire 150 or a flip scheme.

The resin member 170 comprises a material, such as silicon resin or epoxy resin, having light transmittance, and is provided with the phosphor 172 and 174. The resin member 170 is molded in the area of the cavity 125. The resin member 170 is molded around the light emitting diode chip 130 disposed in the cavity 125.

The resin member 170 comprises a silicate-based yellow phosphor 172, which is $Sr_{3-x}SiO_5:Eu^{2+}_x(0<x \leq 1)$, together with a silicate-based green phosphor 174, which is one of $Ba_{2-x}SiO_4:Eu^{2+}_x$, $Ca_{1-x}MgSi_2O_7:Eu^{2+}_x$, and $Sr_{2-x}SiO_4:Eu^{2+}_x$ $(0.001 \leq x \leq 1)$. The silicate-based yellow phosphor 172 emits yellow light by exciting a portion of blue light, in which the yellow light has the center of excited wavelengths corresponding to a main peak of wavelengths in the range of 550 nm to 600 nm. The silicate-based green phosphor 174 emits green light by exciting a portion of blue light, in which the green light has the center of excited wavelengths corresponding to a main peak of wavelengths in the range of 500 nm to 550 nm.

The silicate-based yellow phosphor 172 absorbs a portion of light emitted from the light emitting diode chip 130 to emit yellow light, and the silicate-based green phosphor 174 absorbs a portion of light emitted from the light emitting diode chip 130 to emit green light. Accordingly, the blue light from the light emitting diode chip 130 is mixed with the yellow light and the green light from the silicate-based yellow phosphor 172 and the silicate-based green phosphor 174, so that white light is emitted. In this case, the resin member 170 may employ at least one of a silicate-based yellow phosphor and a silicate-based green phosphor prepared through the sol-gel method according to the embodiment.

The resin member 170 may comprise the silicate-based yellow phosphor 172 and the silicate-based green phosphor 174 with the mixing ratio of the silicate-based yellow phosphor 172 to the silicate-based green phosphor 174 in the range of 1:1 to 1:9 or 1:9 to 1:1. In the case of bluish white, the resin member 170 may comprise the silicate-based yellow phosphor 172 and the silicate-based green phosphor 174 with the mixing ratio of the silicate-based yellow phosphor 172 to the silicate-based green phosphor 174 in the range of 1:2 to 1:5.

FIG. 4 is a sectional view showing the structure of a vertical-lamp-type white light emitting diode 200 employing a phosphor using a sol-gel method according to the embodiment.

Referring to FIG. 4, the vertical-lamp-type white light emitting diode 200 comprises a plurality of lead frames 210, a blue light emitting diode chip 230 mounted on the lead frame 210, a wire 250 for electrically connecting the lead frame 210 with the light emitting diode chip 230, a resin member 270 molded around the light emitting diode chip 230, and an exterior material 280.

The resin member 270 comprises a silicate-based yellow phosphor 272, which is $Sr_{3-x}SiO_5:Eu^{2+}_x$ ($0<x\leq1$), together with a silicate-based green phosphor 274, which is one of $Ba_{2-x}SiO_4:Eu^{2+}_x$, $Ca_{1-x}MgSi_2O_7:Eu^{2+}_x$, and $Sr_{2-x}SiO_4:Eu^{2+}_x$ ($0.001\leq x\leq1$).

The silicate-based yellow phosphor 272 absorbs a portion of light emitted from the light emitting diode chip 230 to emit yellow light, and the silicate-based green phosphor 274 absorbs a portion of light emitted from the light emitting diode chip 230 to emit green light. Accordingly, the blue light from the light emitting diode chip 230 is mixed with the yellow light and the green light from the silicate-based yellow phosphor 272 and the silicate-based green phosphor 274, so that white light is emitted.

In detail, the permeable resin member 270 is molded to surround the light emitting diode chip 230 and comprises the silicate-based yellow phosphor 272, which has a main peak of wavelengths in the rang of 550 nm to 600 nm, and the silicate-based green phosphor 274, which has a main peak of wavelengths in the range of 500 nm to 550 nm, excited by blue light (with wavelengths in the range of 400 nm to 480 nm) emitted from the light emitting diode chip 230.

At this time, in the silicate-based yellow phosphor 272, light having the main peak of wavelengths in the range of 550 nm to 600 nm is excited by the blue light (with wavelengths in the range of 400 nm to 480 nm) emitted from the light emitting diode chip 230. In the silicate-based green phosphor 274, light having the main peak of wavelengths in the range of 500 nm to 550 nm is excited by the blue light from the light emitting diode chip 230.

In a phosphor and a method for preparing the phosphor, and a light emitting diode using the phosphor according to the embodiment, the phosphor is prepared through a sol-gel method, so that the homogeneity of a multi-component compound can be increased, and the multi-component compound can be densely calcined.

In addition, the luminance of the phosphor can be improved, so that the luminance of a white light emitting diode employed for an LCD light source, an LED lamp, an LED for an indicator, and a fluorescent lamp can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for preparing a phosphor, the method comprising:
preparing a precursor solution by mixing strontium nitrate ($Sr(NO_3)_2$), tetraethyl orthosilicate (TEOS), and europium oxide (Eu) with each other;
forming a gel by heating the precursor solution;
drying the gel specimen;
performing calcination by removing water and organic materials from the dried gel; and
preparing a phosphor by reducing the Eu of the gel,
wherein pH of the precursor solution is adjusted to 1 in order to obtain spherical phosphor particles, and
wherein the strontium nitrate, the TEOS and the Eu of the precursor solution are mixed with each other in a ratio of (3-x) mol to 1 mol to x mol, where $0.001\leq x\leq1$, respectively.

2. The method as claimed in claim 1, wherein the precursor solution is prepared by dissolving the TEOS in ethanol, dissolving the $Sr(NO_3)_2$ in water, and then mixing the resultant solution with an activator.

3. The method as claimed in claim 1, wherein, in the dry step, the gel is heated under a temperature in a range of 80° C. to 200° C. for 23 hours to 25 hours.

4. The method as claimed in claim 1, wherein, in the calcination step, the gel is heated under a temperature in a range of 500° C. to 1000° C. for one hour to five hours.

5. The method as claimed in claim 1, wherein, in the reduction step, the gel is heated at a hydrogen gas atmosphere under a temperature in a range of 1200° C. to 1350° C. for three hours to five hours.

6. The method as claimed in claim 1,
wherein the phosphor comprises a silicate-based yellow phosphor comprising a chemical formula $Sr_{3-x}SiO_5:Eu^{2+}_x$, where $0.001\leq x\leq1$, and
wherein the silicate-based yellow phosphor emits light having a main wavelength peak in an approximate range of 550 nm to 600 nm by exciting a blue light.

7. The method as claimed in claim 1,
wherein the phosphor comprises a silicate-based green phosphor comprising at least one of a chemical formula of $Sr_{2-x}SiO_4:Eu^{2+}_x$, $Ba_{2-x}SiO_4:Eu^{2+}_x$, and $Ca_{1-x}MgSi_2O_7:Eu^{2+}_x$, where $0.001\leq x\leq1$, and
wherein the silicate-based green phosphor emits light having a main wavelength peak in an approximate range of 500 nm to 550 nm by exciting a blue light.

8. The method as claimed in claim 1, wherein a ratio of water to the TEOS is 60~90:1.

9. The method as claimed in claim 1, comprising a step of pulverizing the gel before or after the gel is dried.

* * * * *